(12) United States Patent
Lai et al.

(10) Patent No.: US 10,816,879 B2
(45) Date of Patent: Oct. 27, 2020

(54) ASSEMBLING METHOD OF CAMERA MODULE

(71) Applicant: Primax Electronics Ltd., Taipei (TW)

(72) Inventors: Chin-Ding Lai, Taipei (TW); Han-Kai Wang, Taipei (TW); Yong-De Huang, Taipei (TW)

(73) Assignee: PRIMAX ELECTRONICS LTD, Taipei (TW)

( * ) Notice: Subject to any disclaimer, the term of this patent is extended or adjusted under 35 U.S.C. 154(b) by 314 days.

(21) Appl. No.: 16/110,657

(22) Filed: Aug. 23, 2018

(65) Prior Publication Data

US 2019/0353986 A1 Nov. 21, 2019

(30) Foreign Application Priority Data

May 18, 2018 (CN) .......................... 2018 1 0481847

(51) Int. Cl.
*G03B 17/12* (2006.01)
*H01L 27/146* (2006.01)

(52) U.S. Cl.
CPC .......... *G03B 17/12* (2013.01); *H01L 27/1469* (2013.01); *H01L 27/14618* (2013.01); *H01L 27/14634* (2013.01); *H01L 27/14636* (2013.01)

(58) Field of Classification Search
CPC .............. G03B 17/12; H01L 27/14618; H01L 27/14634; H01L 27/1469
See application file for complete search history.

(56) References Cited

U.S. PATENT DOCUMENTS

| 5,721,990 | A | * | 2/1998 | Akaiwa | G02F 1/133512 349/110 |
| 5,786,589 | A | * | 7/1998 | Segawa | H01L 27/14618 250/208.1 |
| 6,605,828 | B1 | * | 8/2003 | Schwarzrock | G01D 5/34715 257/678 |
| 6,833,612 | B2 | * | 12/2004 | Kinsman | H01L 27/14634 257/680 |
| 7,414,663 | B2 | * | 8/2008 | Hoshino | H04N 5/2257 348/340 |
| 7,795,066 | B2 | * | 9/2010 | Tsai | H01L 27/14618 438/65 |
| 9,761,630 | B2 | * | 9/2017 | Sakota | H01L 27/14618 |
| 2006/0109366 | A1 | * | 5/2006 | Humpston | H01L 27/14625 348/340 |

FOREIGN PATENT DOCUMENTS

CN 100501483 C * 6/2009

* cited by examiner

*Primary Examiner* — Carl J Arbes
(74) *Attorney, Agent, or Firm* — Kirton McConkie; Evan R. Witt

(57) ABSTRACT

An assembling method is provided for assembling a camera module with a substrate and a lens module includes the following steps. In a step (A), a sensing chip is installed on a surface of the substrate. In a step (B), a fixture is assembled with the substrate, wherein plural inner walls of the fixture are arranged around at least a lateral edge of the substrate. In a step (C), a glue is coated on a periphery of the surface of the substrate, wherein a movable range of the glue is limited by the plural inner walls of the fixture. In a step (D), a lens holder of the lens module is installed on the surface of the substrate, so that the lens holder and the substrate are combined together through the glue. In a step (E), the fixture is separated from the substrate.

11 Claims, 10 Drawing Sheets

ASSEMBLING METHOD OF CAMERA MODULE

FIELD OF THE INVENTION

The present invention relates to a camera module, and more particularly to a camera module for a portable electronic device.

BACKGROUND OF THE INVENTION

Recently, mobile communication devices, personal digital assistants (PDA) or other portable electronic devices with image-shooting functions are widely used. Since the portable electronic devices are carried easily, the image-shooting functions become the basic functions of the portable electronic devices. In other words, the portable electronic device is equipped with a camera module.

The structure of a conventional camera module will be illustrated with reference to FIGS. 1 and 2. FIG. 1 is a schematic perspective view illustrating the outward appearance of a conventional camera module. FIG. 2 is a schematic side view illustrating the conventional camera module as shown in FIG. 1. For example, the conventional camera module is disclosed in Taiwanese Patent Application No. TW106130015, which was filed by the same Applicant of this application. The camera module 1 comprises a substrate 11, a sensing chip 12 and a lens module 13. The lens module 13 comprises a lens holder 131 and a lens group 132. The sensing chip 12 is disposed on a first surface 111 of the substrate 11 and electrically connected with the substrate 11. The lens group 132 is supported on the lens holder 131. The lens holder 131 covers a top surface 111 of the substrate 11. Consequently, the sensing chip 12 is arranged between the lens module 13 and the substrate 11. After the above components are combined together, the camera module 1 is assembled. After the external light beam passes through the lens group 132 and the lens holder 131 sequentially, the external light beam is projected on the sensing chip 12. Consequently, the sensing chip 12 produces the corresponding image.

Moreover, the lens holder 131 of the lens module 13 and the substrate 11 are combined together through a thermosetting glue 14, and a great amount of thermosetting glue 14 is used to assure the imaging quality of the camera module 1. The use of the great amount of thermosetting glue 14 has the following benefits. Firstly, the sensing chip 12 is completely sealed within the space between the lens holder 131 of the lens module 13 and the substrate 11 because of the great amount of thermosetting glue 14. Since the particles in the surroundings are prevented from entering the camera module 1, the travelling path of the light beam is not adversely affected. Secondly, the unpredicted light beam in the surroundings (e.g., a stray light) is blocked by the great amount of thermosetting glue 14 and prevented from entering the camera module 1.

However, since a great amount of thermosetting glue 14 is used and the thermosetting glue 14 has flowability, the assembling process of the conventional camera module 1 still has some drawbacks. For example, the excess thermosetting glue 14 is readily retained on the lateral periphery between the substrate 11 and the lens holder 131 of the camera module 1. In addition, after the excess thermosetting glue 14 is baked at the high temperature, the excess thermosetting glue 14 is solidified. Under this circumstance, some salient structures 141 are protruded from the lateral periphery between the substrate 11 and the lens holder 131 (see FIG. 3). Because of these salient structures 141, the size of the camera module 1 possibly exceeds the standard. Consequently, while the camera module 1 is placed on a portable electronic device (not shown), an interference problem occurs. As the trends of designing the portable electronic device is toward miniaturization, the interference problem resulted from the salient structures 141 of the thermosetting glue 14 during the process of placing the camera module 1 on the portable electronic device becomes more serious.

For solving the above drawbacks, an additional glue-removing step is required after the lens holder 131 of the lens module 13 and the substrate 11 are combined together through the thermosetting glue 14. That is, the glue-removing step is performed to remove the salient structures 141 that are formed of the excess thermosetting glue 14. Generally, there are three approaches of performing the glue-removing step. In accordance with a first approach, the salient structures 141 that are formed of the excess thermosetting glue 14 are removed by using a laser cutting method. However, this approach generates the material burning mark and needs high fabricating cost. In accordance with a second approach, the salient structures 141 that are formed of the excess thermosetting glue 14 are removed by using a diamond water jet method. However, since the dust readily enters the sensing chip 12, the imaging quality is adversely affected. In addition, a large area to be cut needs to be retained. In accordance with a second approach, the salient structures 141 that are formed of the excess thermosetting glue 14 are removed by using a fine sane grinding method. Similarly, since the dust readily enters the sensing chip 12, the sensing chip 12 is contaminated and the imaging quality is deteriorated.

As mentioned above, the assembling process of the conventional camera module needs to be further improved.

SUMMARY OF THE INVENTION

An object of the present invention provides an efficient method for assembling a camera module without a glue-removing step. Before the glue is applied to the substrate, plural inner walls of the fixture are arranged around the lateral edges of the substrate to limit the movable range of the glue. Consequently, the glue will not flow to the outside of the substrate, or the overflow amount of the glue to the outside of the substrate will be minimized. After the glue is baked at the high temperature, the size of the camera module still complies with the standard. In comparison with the conventional technology, the glue-removing step is omitted. Consequently, while the camera module is placed on a portable electronic device, the interference problem will be overcome.

In accordance with an aspect of the present invention, there is provided an assembling method of a camera module. The camera module includes a substrate and a lens module. The assembling method includes the following steps. In a step (A), a sensing chip is installed on a surface of the substrate. In a step (B), a fixture is assembled with the substrate, wherein plural inner walls of the fixture are arranged around at least a lateral edge of the substrate. In a step (C), a glue is coated on a periphery of the surface of the substrate, wherein a movable range of the glue is limited by the plural inner walls of the fixture. In a step (D), a lens holder of the lens module is installed on the surface of the substrate, so that the lens holder and the substrate are combined together through the glue. In a step (E), the fixture is separated from the substrate.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention provides an assembling method of a camera module. The structure of the camera module will be illustrated as follows.

Figure 1:
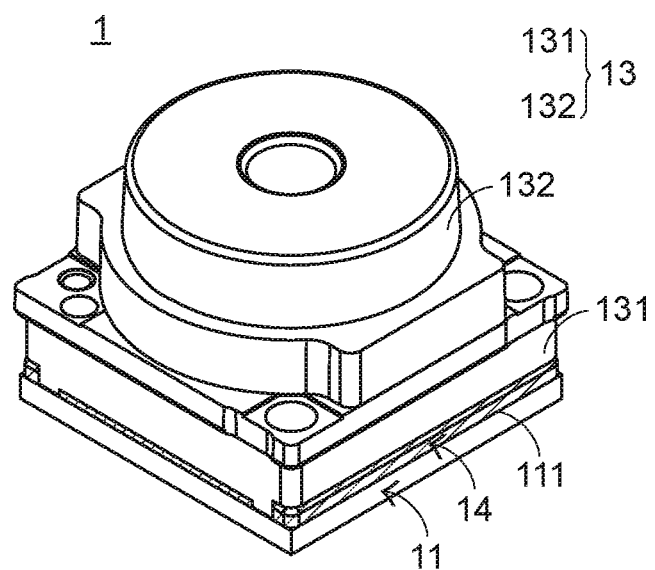
FIG. 1 is a schematic perspective view illustrating the outward appearance of a conventional camera module.
Figure 2:
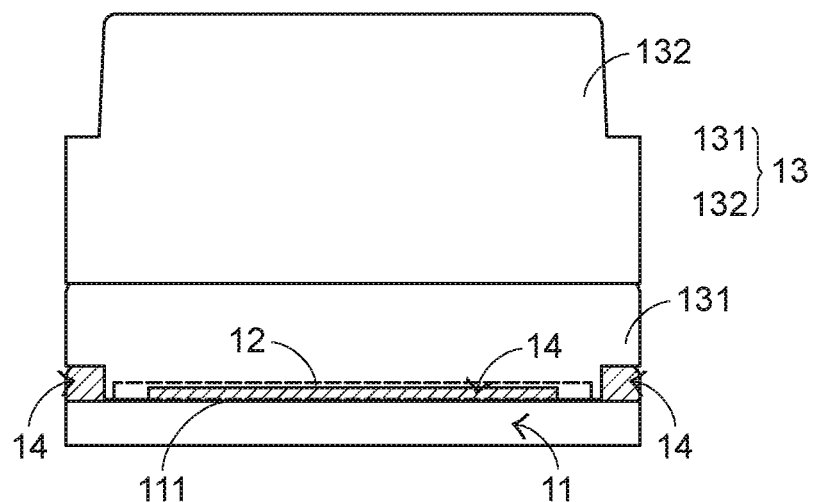
FIG. 2 is a schematic side view illustrating the conventional camera module as shown in FIG. 1.
Figure 3:
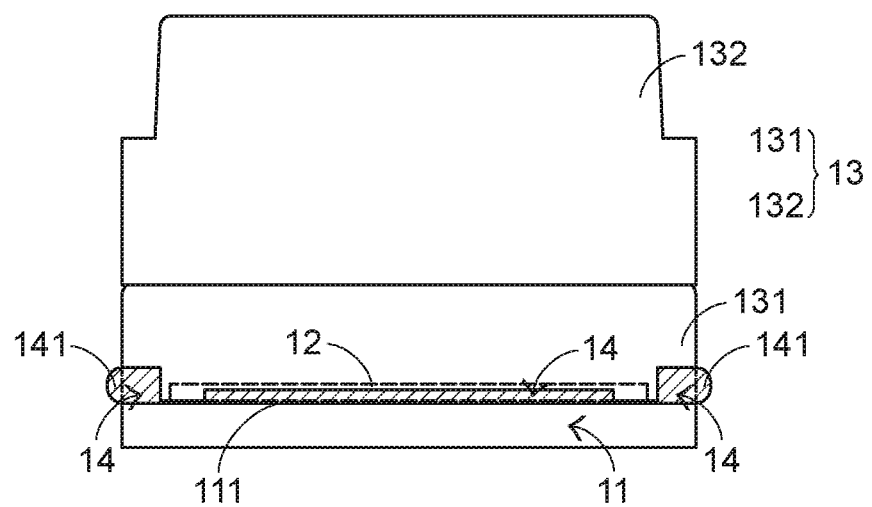
FIG. 3 is a schematic side view illustrating the conventional camera module after the excess thermosetting glue is baked at a high temperature and solidified.
Figure 4:
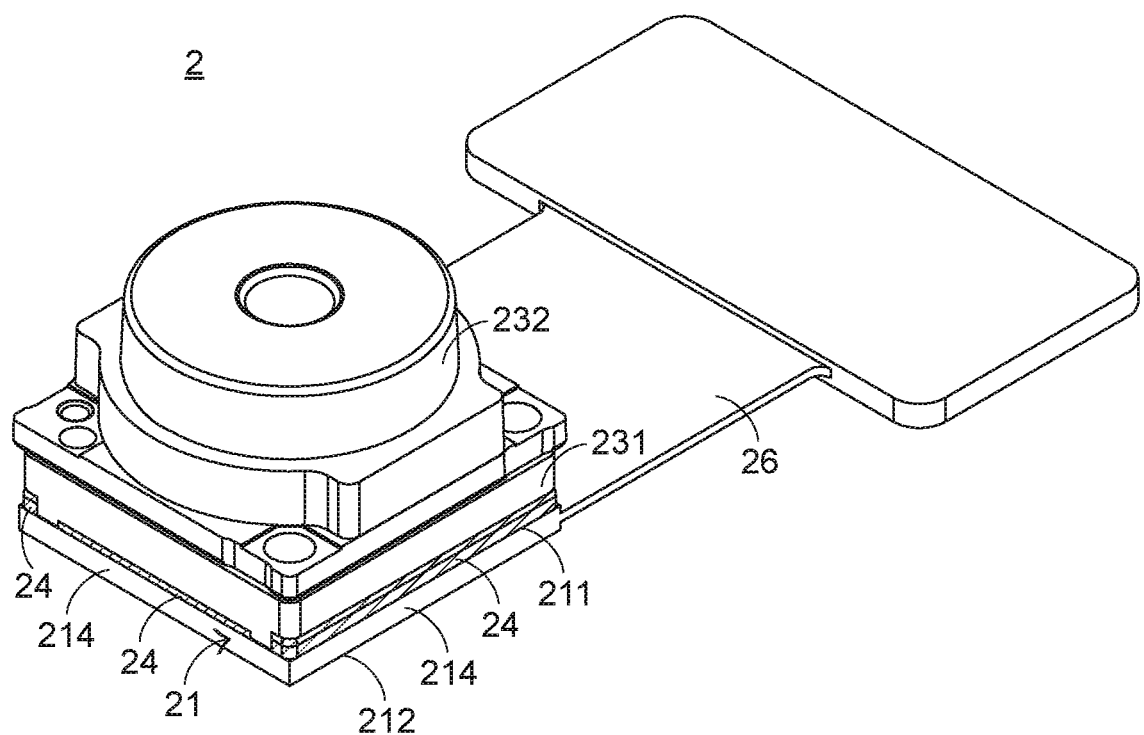
FIG. 4 is a schematic perspective view illustrating the outward appearance of a camera module according to an embodiment of the present invention.
Figure 5:
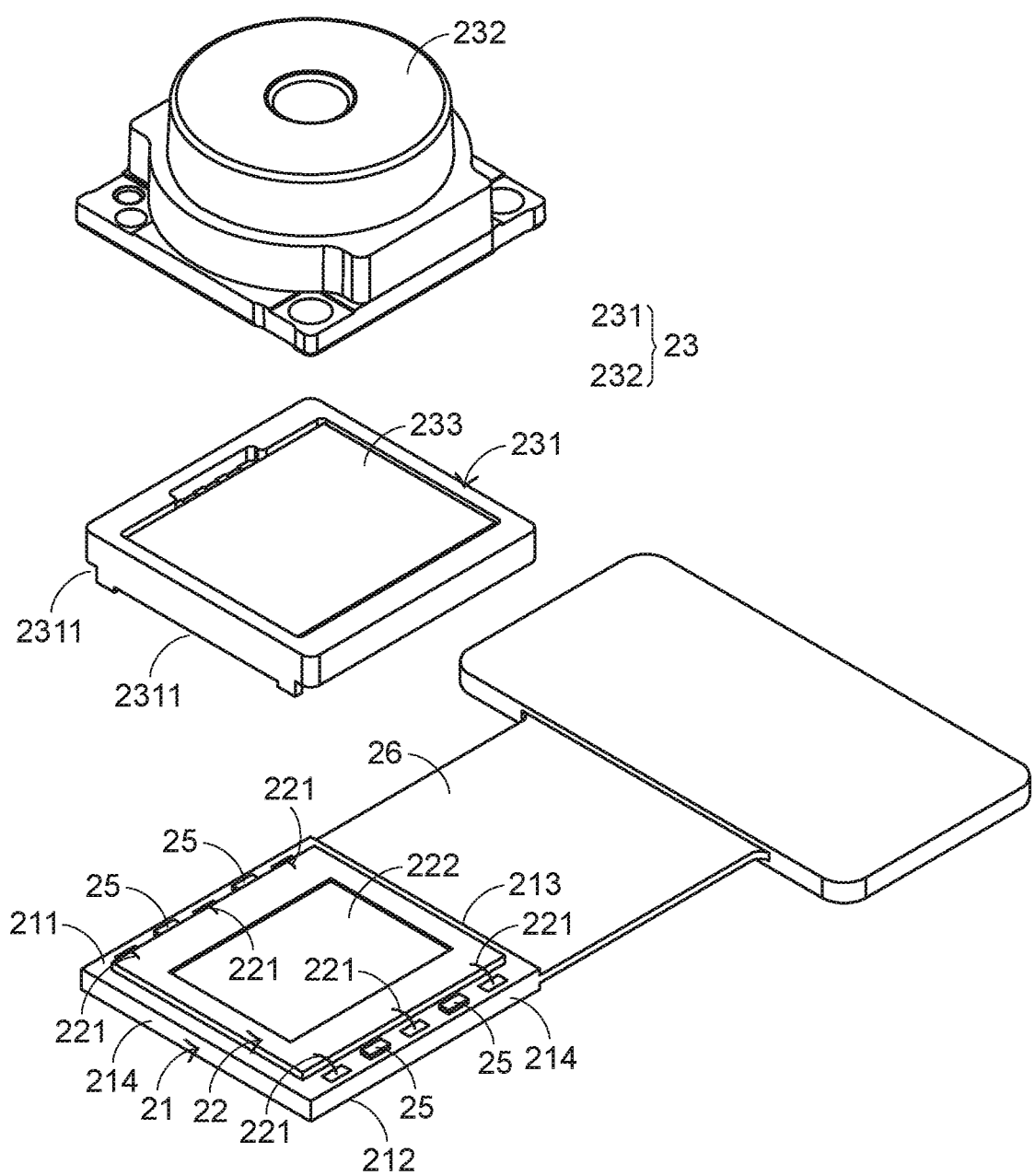
FIG. 5 is a schematic exploded view illustrating a portion of the camera module as shown in FIG. 4.

Please refer to FIGS. 4 and 5. FIG. 4 is a schematic perspective view illustrating the outward appearance of a camera module according to an embodiment of the present invention. FIG. 5 is a schematic exploded view illustrating a portion of the camera module as shown in FIG. 4. The camera module 2 comprises a substrate 21, a sensing chip 22, a lens module 23 and plural electronic components 25. The lens module 23 comprises a lens holder 231 and a lens group 232. The lens holder 231 is equipped with a covering element 233 (e.g., a blue glass plate). The substrate 21 comprises plural lateral edges 213 and 214. The lateral edge 213 is connected with a first end of a flexible printed circuit board 26. The camera module 2 is installed in a portable electronic device (not shown). A second end of the flexible printed circuit board 26 is electrically connected with a main board (not shown) of the portable electronic device. Consequently, signals can be transferred between the substrate 21 and the main board of the portable electronic device. Preferably but not exclusively, the substrate 21 is a rigid-flex board, a FR4 copper clad laminate or a ceramic substrate.

The sensing chip 22 is disposed on a top surface 211 of the substrate 21. The sensing chip 22 comprises plural welding parts 221 and a sensing region 222. The plural welding parts 221 are bonding wires that are produced by a wire bonding process. The sensing chip 22 is electrically connected with the substrate 21 through the plural welding parts 221. The plural electronic components 25 includes memories (e.g., electrically-erasable programmable read-only memory (EEPROM)), passive components (e.g., resistors or capacitors), and so on. The electronic components 25 are used for providing associated electronic functions. The plural electronic components 25 are disposed on the top surface 211 or a bottom surface 212 of the substrate 21.

The lens group 232 is supported on the lens holder 231. The lens group 232 comprises at least one lens (not shown). The top surface 211 of the substrate 21 is covered by the lens holder 231. Consequently, the sensing chip 22 is arranged between the lens module 23 and the substrate 21. The lens holder 231 comprises plural concave structures 2311. The concave structures 2311 are formed in a bottom surface of the lens holder 232. The welding parts 221 and the electronic components 25 are accommodated within the corresponding concave structures 2311. After the above components are combined together, the camera module 2 is assembled. After the external light beam passes through the lens group 232 and the lens holder 231 sequentially, the external light beam is projected on the sensing region 222 of the sensing chip 22. Consequently, the sensing chip 22 produces the corresponding image.

Figure 6:
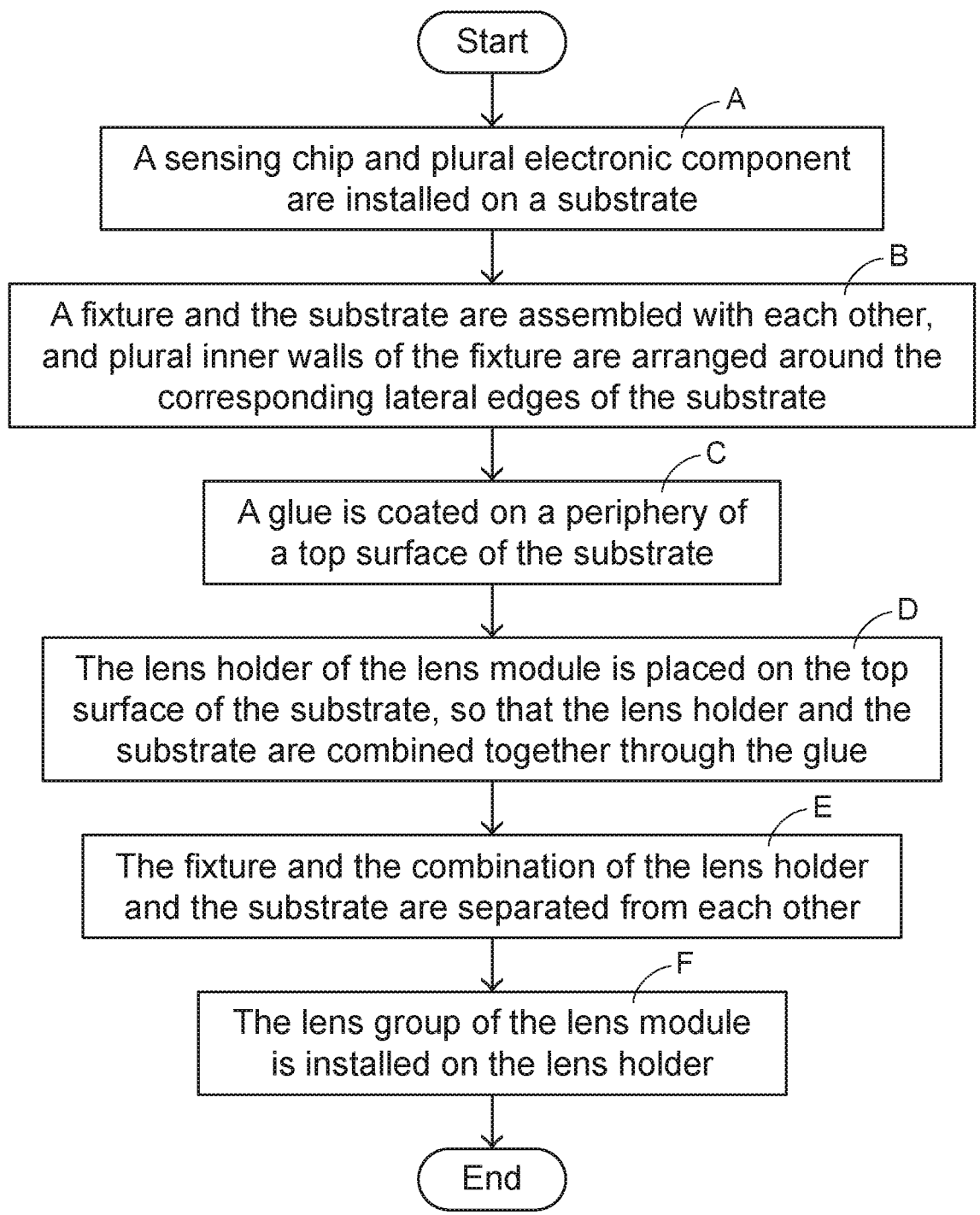
FIG. 6 is a flowchart illustrating an assembling method of a camera module according to an embodiment of the present invention.

An assembling method of the camera module 2 will be illustrated as follows. FIG. 6 is a flowchart illustrating an assembling method of a camera module according to an embodiment of the present invention. The assembling method comprises the following steps.

In a step A, the sensing chip and the plural electronic component are installed on the substrate. In a step B, a fixture and the substrate are assembled with each other, and plural inner walls of the fixture are arranged around the corresponding lateral edges of the substrate. In a step C, a glue is coated on a periphery of a top surface of the substrate. In a step D, the lens holder of the lens module is placed on the top surface of the substrate, so that the lens holder and the substrate are combined together through the glue. In a step E, the fixture and the combination of the lens holder and the substrate are separated from each other. In a step F, the lens group of the lens module is installed on the lens holder.

Figure 7A:
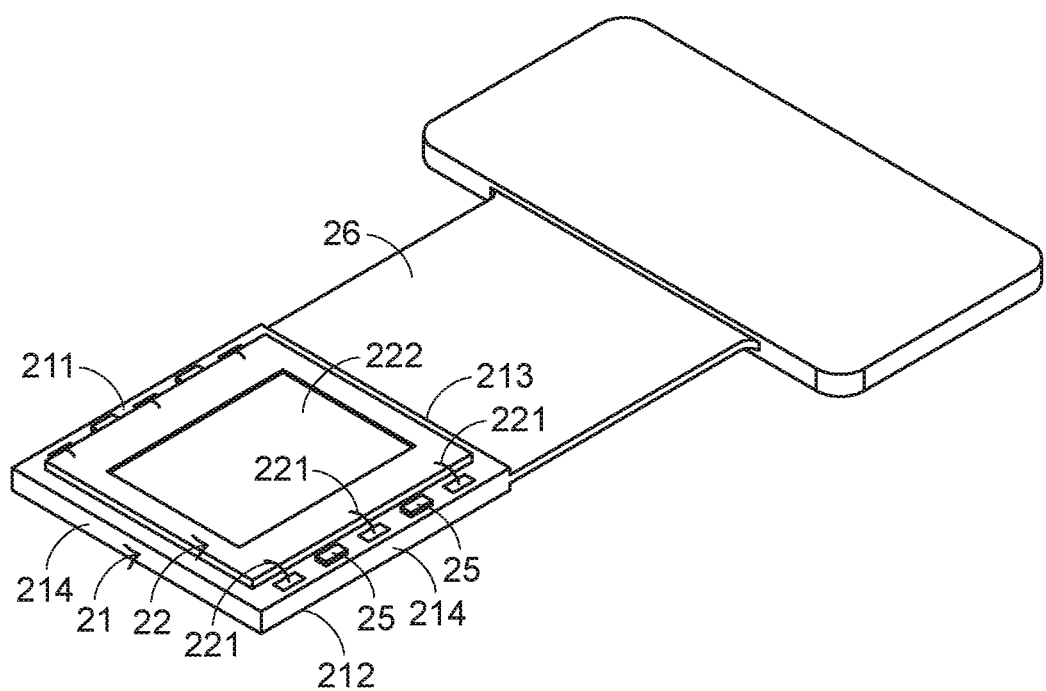
FIG. 7A is a schematic perspective view illustrating a step A of the assembling method of the present invention.

An implementation example of the assembling method of the camera module will be illustrated in more details as follows. FIGS. 7A~7G schematically illustrate the steps of assembling the camera module of the present invention. Please refer to FIGS. 6 and 7A~7G In FIGS. 7B~7E, the components are shown in top views. In FIGS. 7F and 7G, the components are shown in side views.

After the assembling method of the camera module 2 is started, the step A is performed to install the sensing chip 22 and the plural electronic component 25 on the substrate 21. The sensing chip 22 is installed on the top surface 211 of the substrate 21. Moreover, the sensing chip 22 is electrically connected with the substrate 21 through the plural welding parts 221. According to the practical requirements, the electronic components 25 are installed on the top surface 211 or the bottom surface 212 of the substrate 21. Preferably but not exclusively, the plural electronic component 25 are installed on the top surface 211 or the bottom surface 212 of the substrate 21 through a surface mount technology (SMT). The combination of the sensing chip 22, the plural electronic components 25 and the substrate 21 is shown in FIG. 7A.

Figure 7B:
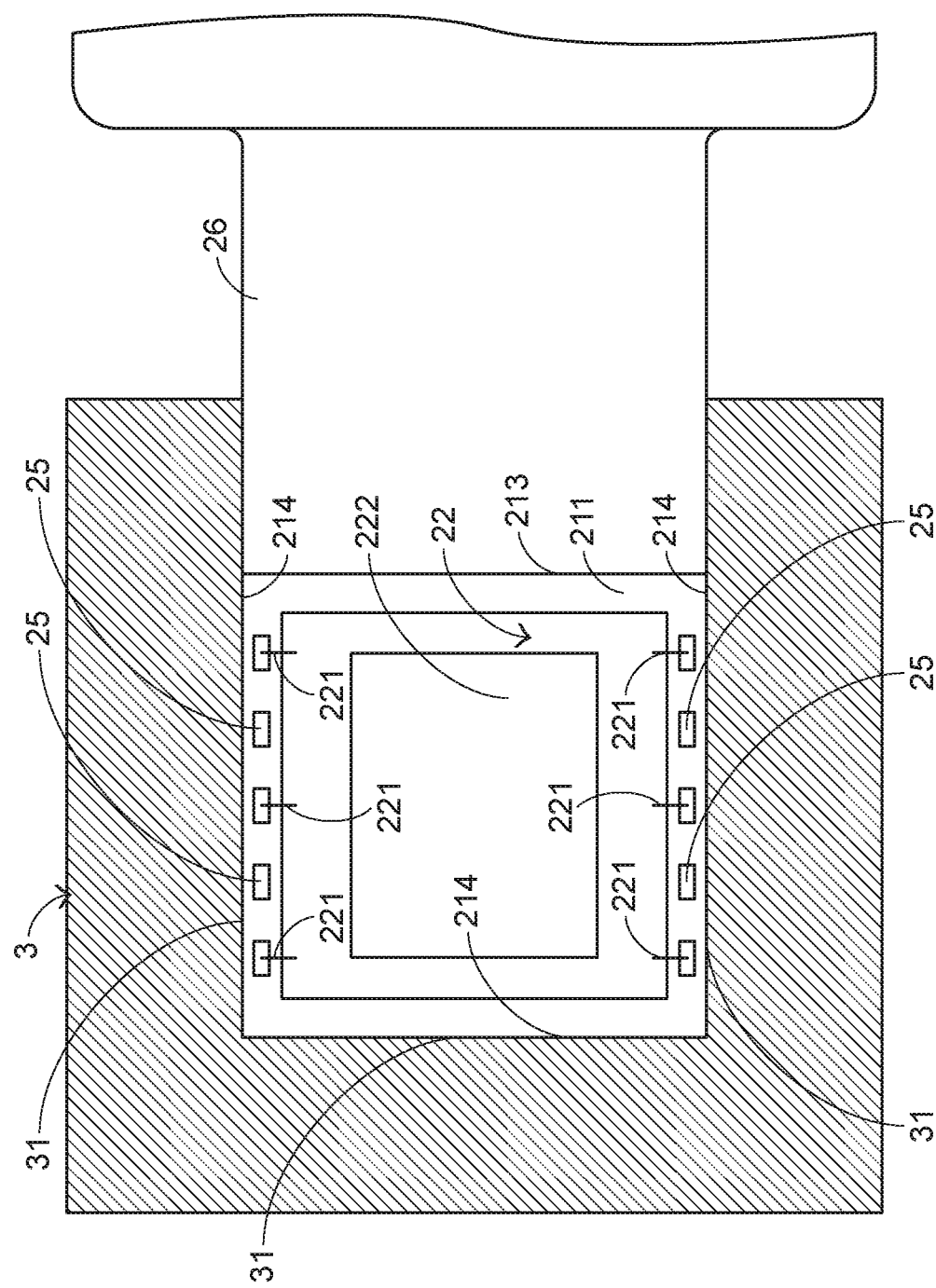
FIG. 7B is a schematic top view illustrating a step B of the assembling method of the present invention.

Then, as shown in FIG. 7B and the step B of FIG. 6, a fixture 3 and the substrate 21 are assembled with each other. Consequently, plural inner walls 31 of the fixture 3 are arranged around the corresponding lateral edges of the substrate 21. As shown in FIG. 7B, the lateral edges 241 of the substrate 21 are not connected with the flexible printed circuit board. Preferably, the plural inner walls 31 of the fixture 3 are arranged around the lateral edges 241. The reason will be described as follows. As shown in FIG. 7B, the size of the fixture 3 is specially designed such that the plural inner walls 31 of the fixture 3 are in close contact with the corresponding lateral edges 241 of the substrate 21. It is noted that numerous modifications and alterations may be made while retaining the teachings of the invention. That is, the size of the fixture 3 is designed according to the size of the camera module 2. For example, in another embodiment, each inner wall 31 of the fixture 3 and the corresponding lateral edge 214 of the substrate 21 are separated from each other by a gap, and the gap is smaller than a specified distance.

In a first example of the fixture 3, the inner wall 31 of the fixture 3 is made of a material that is not easily combined with the glue. For example, the inner wall 31 of the fixture 3 is made of polytetrafluoroethylene (PTFE), which is commonly known as Teflon. In a second example of the fixture 3, an electroplating layer is formed on the inner wall 31 of the fixture 3 according to an electroplating process. The electroplating layer is not easily combined with the glue. In a third example of the fixture 3, the inner wall 31 of the fixture 3 has a smooth surface. Consequently, the inner wall 31 is not easily combined with the glue.

Figure 7C:
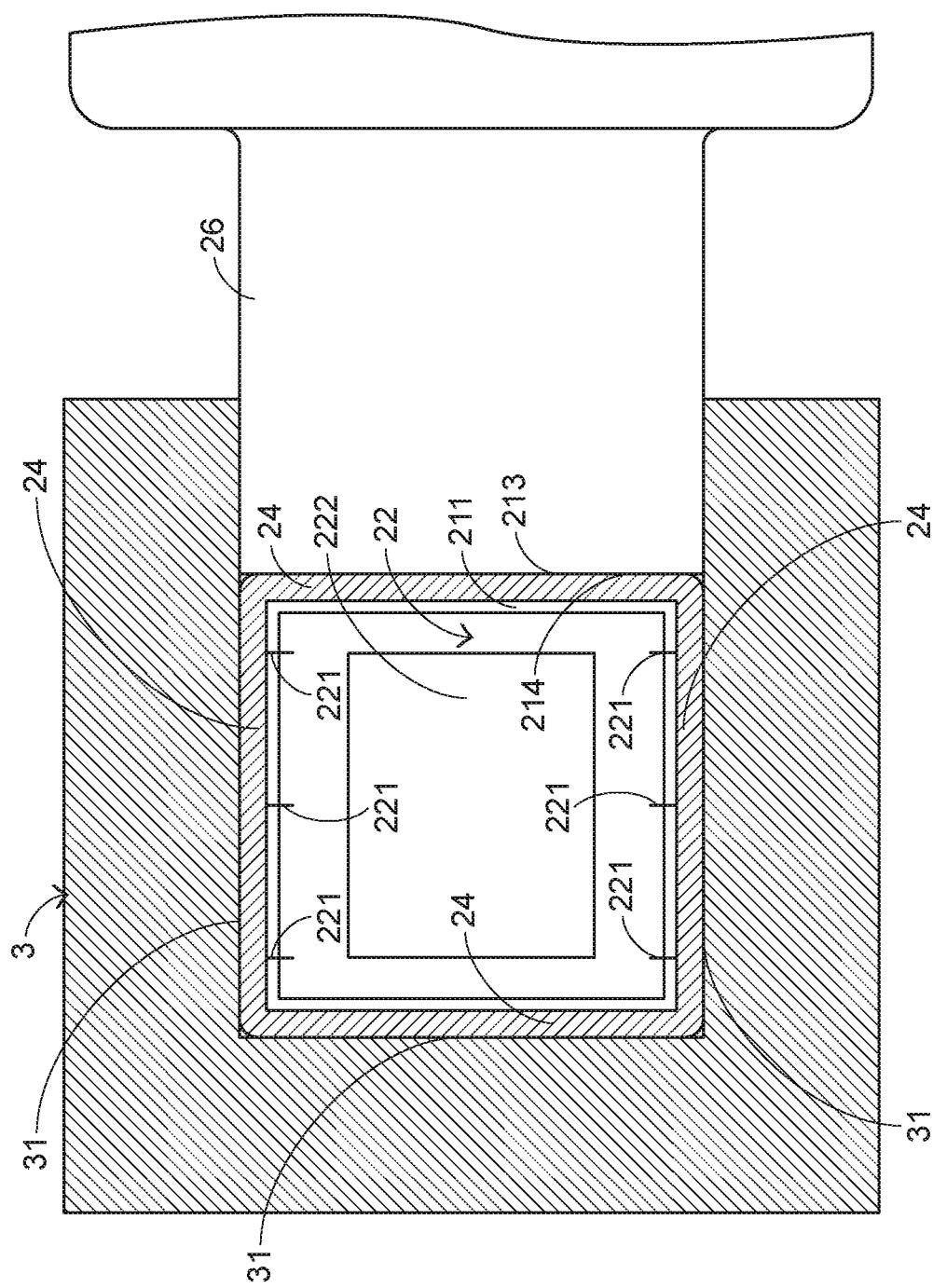
FIG. 7C is a schematic top view illustrating a step C of the assembling method of the present invention.
Figure 7D:
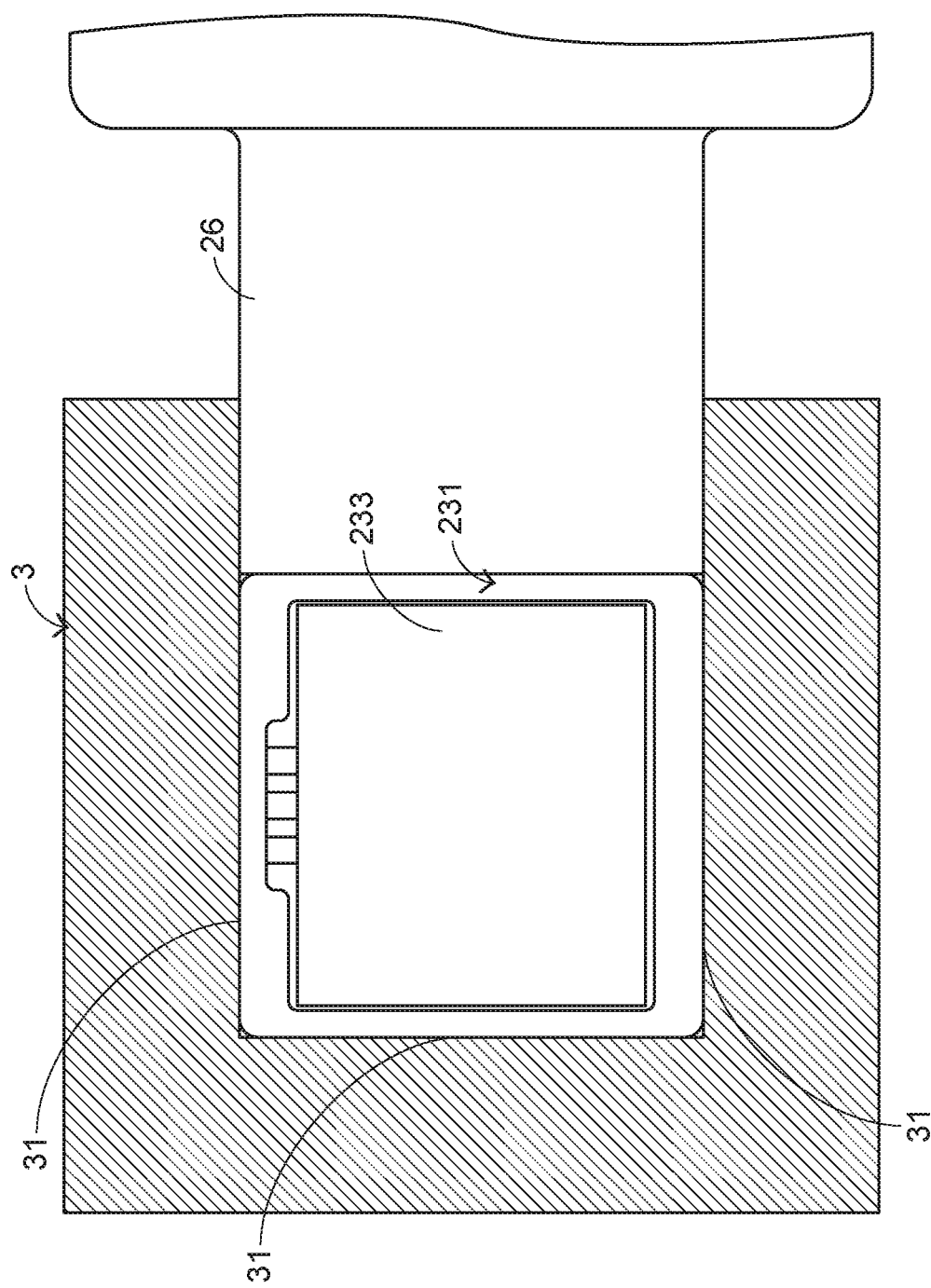
FIG. 7D is a schematic top view illustrating a step D of the assembling method of the present invention.

Please refer to FIG. 7C. After the fixture 3 and the substrate 21 are assembled with each other, the step C is performed. In the step C, a glue 24 is coated on a periphery of the top surface 211 of the substrate 21. Preferably but not exclusively, the glue 24 is a thermosetting glue. Please refer to FIG. 7D. In the step D, the lens holder 231 of the lens module 23 is placed on the top surface 211 of the substrate 21. Consequently, the lens holder 231 and the substrate 21 are combined together through the glue 24.

Preferably, in the step C, a great amount of glue 24 is coated on the periphery of the top surface 211 of the substrate 21 in order to assure the imaging quality of the camera module 2. The use of the great amount of glue 24 has the following benefits. Firstly, the sensing chip 22 is completely sealed within the space between the lens holder 231 of the lens module 23 and the substrate 21 because of the great amount of glue 24. Since the particles in the surroundings are prevented from entering the camera module 2, the travelling path of the light beam is not adversely affected. Secondly, the unpredicted light beam in the surroundings (e.g., a stray light) is blocked by the great amount of glue 24 and prevented from entering the camera module 2.

As mentioned above, the plural inner walls 31 of the fixture 3 are arranged around the lateral edges 241 that are not connected with the flexible printed circuit board. Even if the great amount of glue 24 is used, the movable range of the glue 24 is limited by the inner walls 31 of the fixture 3. Consequently, the glue 24 will not flow to the outside of the substrate 21, or the overflow amount of the glue 24 to the outside of the substrate 21 will be minimized. After the glue 24 is baked at the high temperature, the size of the camera module 2 still complies with the standard.

As mentioned above, the lateral edge 213 of the substrate 21 is not connected with the flexible printed circuit board 26, and the lateral edge 213 of the substrate 21 is not surrounded by the corresponding inner wall 31 of the fixture 3. Consequently, the glue 24 at the junction between the lateral edge 213 of the substrate 21 and the corresponding inner wall 31 of the fixture 3 can still flow. Under this circumstance, the connection between the substrate 21 and the flexible printed circuit board 26 is more firm through the glue 24. Moreover, since the welding parts 221 and the electronic components 25 are partially covered by the glue 24, the efficacy of fixing the welding parts 221 and the electronic components 25 will be enhanced.

Figure 7E:
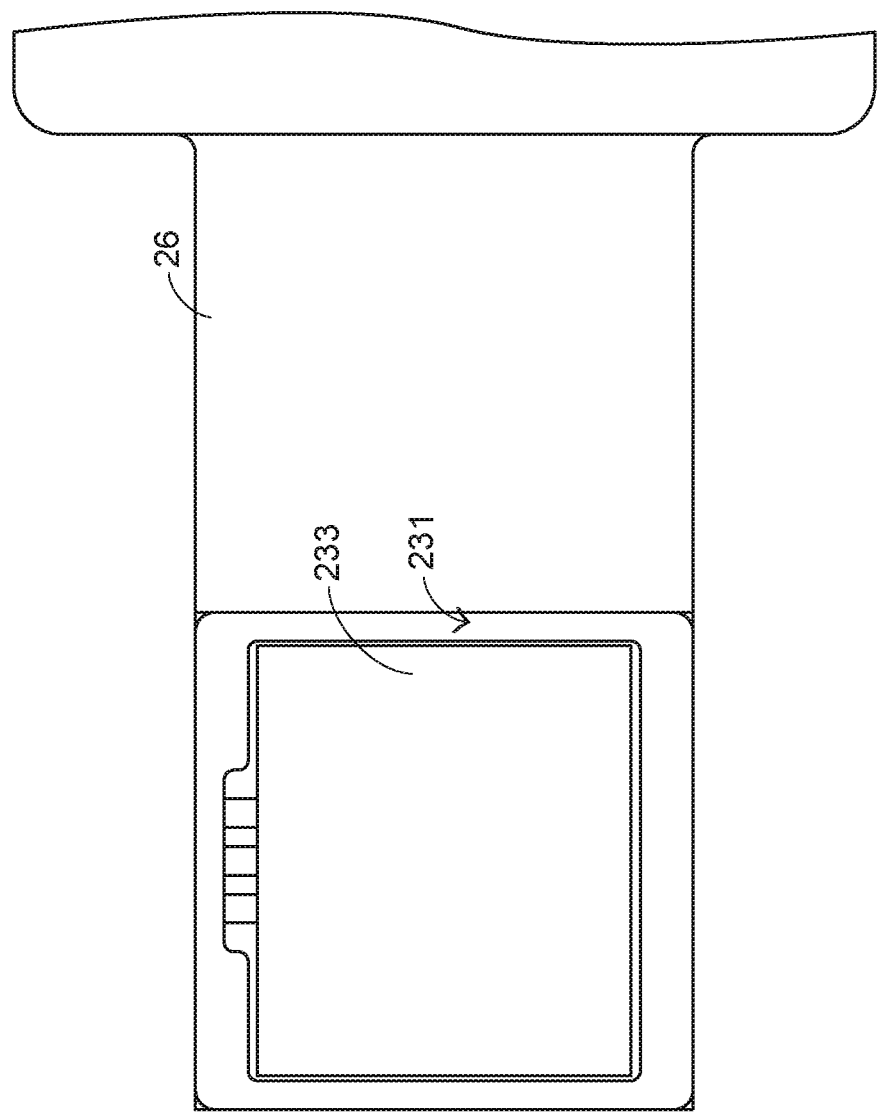
FIG. 7E is a schematic top view illustrating a step E of the assembling method of the present invention.
Figure 7F:
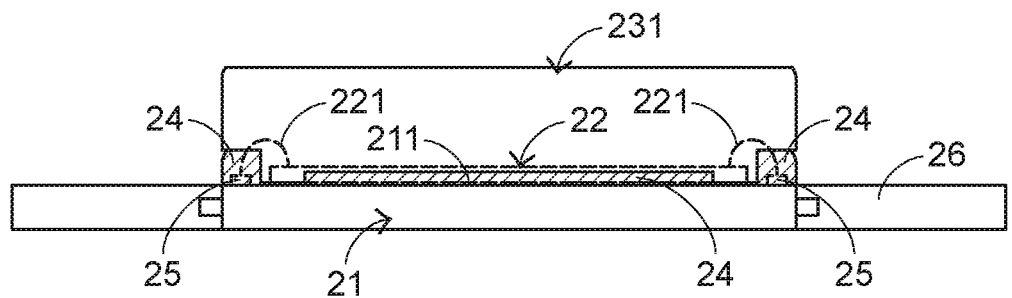
FIG. 7F is a schematic side view illustrating the step E of the assembling method of the present invention.
Figure 7G:
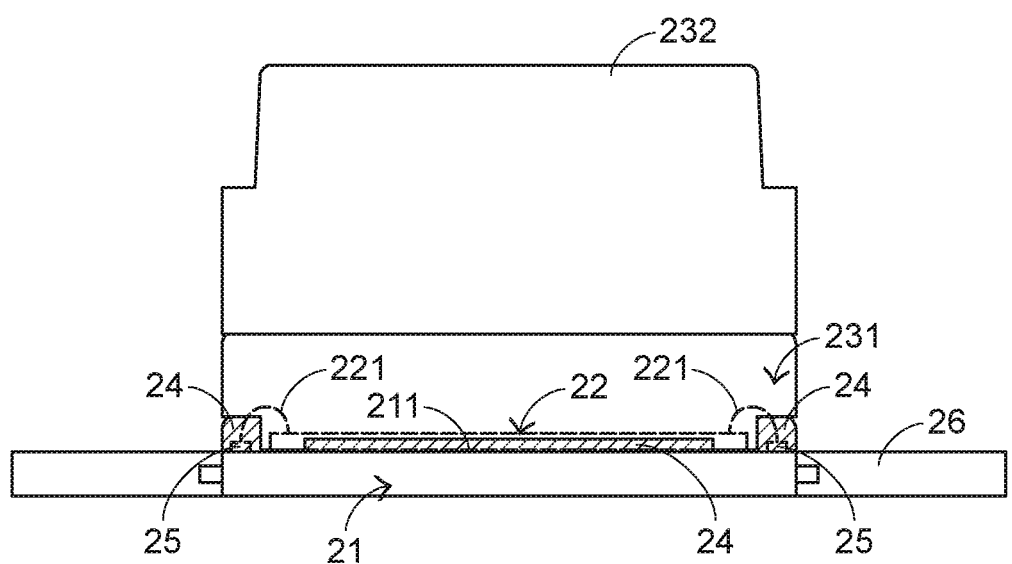
FIG. 7G is a schematic side view illustrating a step F of the assembling method of the present invention.

After the lens holder 231 and the substrate 21 are combined together, the step E is performed. The fixture 3 and the combination of the lens holder 231 and the substrate 21 are separated from each other. After the combination of the lens holder 231 and the substrate 21 is removed from the fixture 3, the combination of the lens holder 231 and the substrate 21 is shown in FIGS. 7E and 7F. As mentioned above, it is difficult to combine the glue 24 with the inner walls 31 of the fixture 3. That is, the fixture 3 can be easily removed from the combination of the lens holder 231 and the substrate 21. The efficacy of removing the fixture 3 easily. Moreover, the fixture 3, the lens holder 231 and the substrate 21 are not suffered from damage. Afterwards, the step F is performed to install the lens group 232 of the lens module 23 on the lens holder 231 (see FIG. 7G). Preferably but not exclusively, the lens group 232 is fixed on the lens holder 231 through an active alignment technology.

From the above descriptions, the present invention provides an assembling method of a camera module. Before the glue 24 is applied to the substrate 21, the plural inner walls 31 of the fixture 3 are arranged around the lateral edges 241 of the substrate 21 to limit the movable range of the glue 24. Consequently, the glue 24 will not flow to the outside of the substrate 21, or the overflow amount of the glue 24 to the outside of the substrate 21 will be minimized. After the glue 24 is baked at the high temperature, the size of the camera module 2 still complies with the standard. In comparison with the conventional technology, the glue-removing step is omitted. Consequently, while the camera module 2 is placed on a portable electronic device, the interference problem will be overcome.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An assembling method of a camera module, the camera module comprising a substrate and a lens module, the assembling method comprising steps of:
    (A) installing a sensing chip on a surface of the substrate;
    (B) assembling a fixture with the substrate, wherein plural inner walls of the fixture are arranged around at least a lateral edge of the substrate;
    (C) coating a glue on a periphery of the surface of the substrate, wherein a movable range of the glue is limited by the plural inner walls of the fixture;
    (D) placing a lens holder of the lens module on the surface of the substrate, so that the lens holder and the substrate are combined together through the glue; and
    (E) separating the fixture from the substrate.

2. The assembling method according to claim 1, wherein after the step (E), the assembling method further comprises a step of:
    (F) installing a lens group of the lens module on the lens holder.

3. The assembling method according to claim 2, wherein in the step (F), the lens group is fixed on the lens holder through an active alignment technology.

4. The assembling method according to claim 1, wherein in the step (D), the sensing chip is sealed between the substrate and the lens holder through the glue.

5. The assembling method according to claim 4, wherein the sensing chip further comprises a welding part, wherein in the step (A), the welding part of the sensing chip is electrically connected with the substrate through a bonding wire.

6. The assembling method according to claim 5, wherein in the step (C), the welding part is partially covered by the glue.

7. The assembling method according to claim 1, wherein an electronic component is further installed on the substrate, wherein in the step (C), the electronic component is partially covered by the glue.

8. The assembling method according to claim 7, wherein the electronic component is a memory or a passive component.

9. The assembling method according to claim 7, wherein the electronic component is installed on the substrate through a surface mount technology.

10. The assembling method according to claim 1, wherein the substrate comprises plural lateral edges, wherein one of the plural lateral edges is connected with a flexible printed circuit board, and the plural inner walls of the fixture are arranged around others of the plural lateral edges.

11. The assembling method according to claim 1, wherein each of the plural inner walls of the fixture is made of a material that is not combined with the glue, or each of the plural inner walls of the fixture has an electroplating layer that is not combined with the glue, or each of the plural inner walls of the fixture has a smooth surface that is not combined with the glue.

* * * * *